US006373765B1

(12) United States Patent
Birk

(10) Patent No.: US 6,373,765 B1
(45) Date of Patent: Apr. 16, 2002

(54) METHOD FOR MULTILEVEL DRAM SENSING

(75) Inventor: Gershom Birk, Burnaby (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 09/585,790

(22) Filed: Jun. 5, 2000

Related U.S. Application Data

(63) Continuation of application No. 09/046,636, filed on Mar. 24, 1998, now Pat. No. 6,151,260.

(30) Foreign Application Priority Data

Sep. 30, 1997  (CA) ............................................. 2217359

(51) Int. Cl.$^7$ ................................................ G11C 7/02
(52) U.S. Cl. ...................................... 365/207; 365/205
(58) Field of Search ............................... 365/207, 197, 365/185.24, 205

(56) References Cited

U.S. PATENT DOCUMENTS 6,151,260 A * 11/2000 Birk ........................... 365/207

* cited by examiner

Primary Examiner—David Nelms
Assistant Examiner—Thong Le
(74) Attorney, Agent, or Firm—Kevin Pillay; Fasken Martineau DuMoulin LLP

(57) ABSTRACT

A method for performing a sense and restore operation in a multilevel DRAM is described. The method describes the selective enabling of the sense amplifiers to operate at predetermined sensing thresholds. The multilevel DRAM stores two bits per cell using a four-voltage-level-per-cell system. Folded bitlines are divided into sub-bitlines each having dedicated sense amplifiers. The sense amplifiers are selectively enabled to operate at predetermined sensing thresholds to thereby greatly simplify the sense and restore operations. The circuit has standard CMOS bitline sense amplifier transistors connected thereto with pull down transistors that may be selectively enabled by switch signals. The length and width of these pull down transistors are varied to thereby effect the switching threshold of the sense amplifier.

10 Claims, 8 Drawing Sheets

METHOD FOR MULTILEVEL DRAM SENSING

This is a continuation of U.S. application Ser. No. 09/046,636 filed Mar. 24, 1998 now U.S. Pat. No. 6,151,260.

This invention relates to dynamic random access memories (DRAMS) and more specifically to multilevel DRAMs which store more than one bit per cell, and to a method for sensing and restoring data in such memories.

BACKGROUND OF THE INVENTION

The density of DRAM may be improved by storing more than one bit in an individual memory cell. It may be seen that in this type of memory a single memory cell does not simply store a two valued binary data (one bit), but rather stores four values (for 2 bits/cell), or eight values (for 3 bits/cell) or in the case of an n-valued memory, 1/n cells hold the same amount of data as in a conventional binary data system.

An example of this kind of multivalued data memory is described in U.S. Pat. No. 4,841,483, in which one of n-different data values can be stored in each memory cell as one of n-different voltage levels. Furthermore, a bitline is divided into (n−1) sub-bitlines and each sub-bitline is connected through a switch element, whereby the (n−1) sub-bitlines are selectively connected or disconnected. Then when the data is to be read out, with the (n−1) sub-bitlines in the connected state, the memory potential of one memory cell is read out after the switch elements are set to the non-conducting state and the bitline is separated into (n−1) sub-bitlines. Next the voltage on each of the (n−1) sub-bitlines is detected using (n−1) sense amplifiers having different standard voltages. On the other hand when data is to be written, with the (n−1) sub-bitlines in the separate state, each sub-bitline is supplied with a voltage corresponding to the data to be written and then the switch elements are put into the conducting state and the (n−1) sub-bitlines are connected together. Thereafter, the bitline potential is determined by capacitive division of the potential of each of the (n−1) sub-bitlines and this potential as written to the selected memory cell.

Other approaches to multilevel memories and sensing and restoring data as described in the following references. U.S. Pat. No. 4,771,404 "Memory Device Employing Multilevel Storage Circuits," Mano et. al; U.S. Pat. Nos. 5,283,761, 5,532,955, 5,612,912, "Method for Multilevel Sense and Restore," Gillingham; Aoki et. al, "A 16-level/cell Dynamic Memory," ISSCC, Feb. 1985; Furuyama, et. al, "An Experimental 2-bit/cell Storage DRAM for Macro Cell or memory-on Logic Application," IEEE JSSC April 1989; Ohta, et. al, "A Novel Memory Cell Architecture for High-Density DRAMs," Symposium on VLSI Circuits, May 1989; Gillingham, "A Sense and Restore Technique for Multilevel DRAM," IEEE JSSC July, 1996; and Murotani et. al, "A 4-Level Storage 4 Gb DRAM," ISSCC, February, 1997.

The Gillingham patents, U.S. Pat. Nos. 5,532,955 and 5,612,912 discuss a multilevel DRAM memory architecture that uses a 2-bit per cell storage system, one bit denoted as the sign and the other bit denoted as the magnitude. The memory utilizes a standard folded bitline DRAM architecture with the addition of several switches and a second sense amplifiers in each column. Typically, folded bitlines are divided into two equal sub-bitlines connected by pass transistors, each connected to separate sense amplifiers. The pair of sub-bitlines on the left and on the right of the pass transistors is each connected to separate sense amplifiers. Sensing of the 2-bits is performed sequentially, first the sign bit then the magnitude bit. The sign bit is used to create the reference level for the magnitude of the sense operation. The sensing method involves sharing the stored charge onto both sub-bitlines, which are then isolated, and one of the voltages is then sensed to provide the sign bit. The charge is, in turn, restored into the cell to preserve it while the sub-bitlines are precharged. A reference voltage is then generated by charge sharing the cell which now holds the sign bit between the precharged sub-bitlines. The magnitude bit is then sensed with respect to the generated reference voltage. The restore operation uses a similar concept in reverse order by charge sharing the sign bit charge on two bitlines with the magnitude bit on one bitline.

This above approach involves complex control logic, which must be carefully timed to allow the described charge sharing to occur. Furthermore, a selected word line must be activated twice within one active cycle and must therefore be controlled by two separate row activation paths. Thus the above as well as previous approaches to sensing and restoring data in multilevel DRAMs have been complex and relatively slow. Furthermore, such approaches required precise timing of various control signals to perform both the sense and restore operations.

SUMMARY OF THE INVENTION

This invention seeks to provide an improved method for performing a sense and restore operation in a multilevel DRAM which is relatively fast and less complex than previous methods, while requiring less precise timing of various control signals to perform both the sense and restore operations.

In accordance with this invention there is provided a multilevel DRAM for storing multiple bits per cell, comprising:

columns of memory cells, each column having bitlines divided into equal sub-bitlines;

voltage sensors coupled to each sub-bitline and each operable at predetermined sensing thresholds; and means for selectively enabling a selected voltage sensor.

BRIEF DESCRIPTION OF THE DRAWINGS

A better understanding of the invention will be obtained by reference to the detailed description below in conjunction with the following drawings in which.

DETAILED DESCRIPTION OF PREFERRED EMBODIMENTS

Figure 1A:
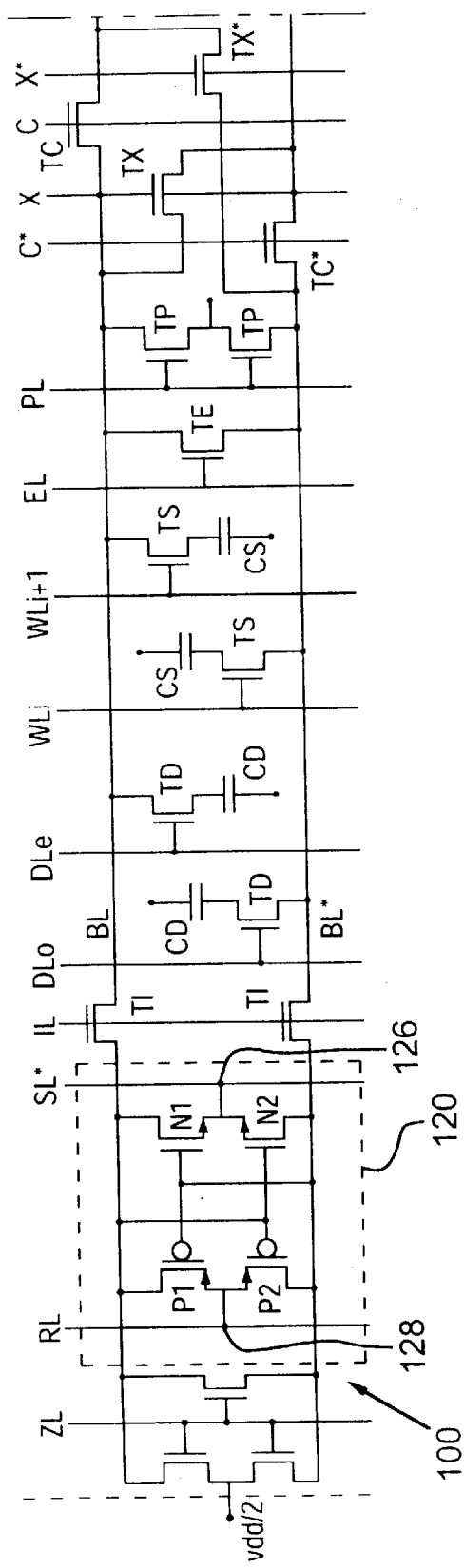
FIGS. 1(a) and (b) shows a multilevel DRAM sense and restore approach and its associated timing diagram according to the prior art.

Referring to FIGS. 1(a) and (b) a schematic diagram of a one half of a single column folded bitline of a multilevel DRAM and its associated timing diagram, according to the prior art is shown generally by numeral 100. For simplicity only the left half of a single column is shown. N-channel pass transistors TC and TC* connect the left and right halves of the bitlines. In the following description, the letters L and R designates signals and devices to the left and right of the pass transistors respectively. Each bitline B and B* is divided into two equal sub-bitlines, BL, BR (not shown) and BL* and BR* (not shown) which are connected by the source drain circuits of the N Ad channel pass transistors TC and TC* the gates of which are controlled by logic signals C and C* respectively. Diagonally opposite sub-bitlines are connected by the source drain circuit of N channel pass devices TX and TX* the gates of which are controlled by signals X and X*. Each-of BL* and BL have respective cell capacitors CS connected thereto via the source drain circuit of a transistor TS. Although only one memory cell CS, TS is shown coupled to each sub-bitline it will be recognized that any number of cells may be coupled to each and they would be an array of columns.

Each sub-bitline has a dummy memory cell capacitor CD connected thereto via the source drain circuit of an access transistor TD. The dummy cells match the storage cells now used to balance the capacitance seen in all sub-bitlines throughout the sense and restore operation. Odd and even dummy word lines DLo, DLe, DRo and DRe are normally enabled. Before a word line WLi or WLi+1 is selected to enable an access transistor TS, the dummy word line on the corresponding sub-bitline is turned off.

The pair of sub-bitlines on the left (BL, BL*) and on the right (BR, BR*) are connected via the source drain circuit of isolation transistors TI to sense amplifiers 120 and 122 (not shown) respectively by asserting the sense amplifier isolation signals IL and IR, respectively to isolation devices TI. The sense amplifier isolation devices TI also allow the sense amplifiers 120 and 122 (not shown) to be shared with adjacent arrays to save chip area.

The sense amplifiers indicated by block 120 comprise a pair of N-channel devices N1 and N2 having their source-drain circuits connected in series between the bitlines BL and BL* and a pair of P channel devices P1 and P2 having their source-drain circuits connected in series between the bitlines BL and BL*. The junction 126 of the N channel transistors N1 and N2 and the P channel transistors P1 and P2 128, respectively is connected to a sense signal SL* and a restore signal RL respectively. These signals are normally held at $V_{DD}/2$.

It may be noted that, word lines and other signals controlling N channel pass devices must be raised to a level higher than $V_{DD}$ in order to pass a "1" level. A $V_{PP}$ level is defined as a voltage sufficiently high to turn on an N channel device having back bias and a source voltage equal to $V_{DD}$.

Figure 1B:
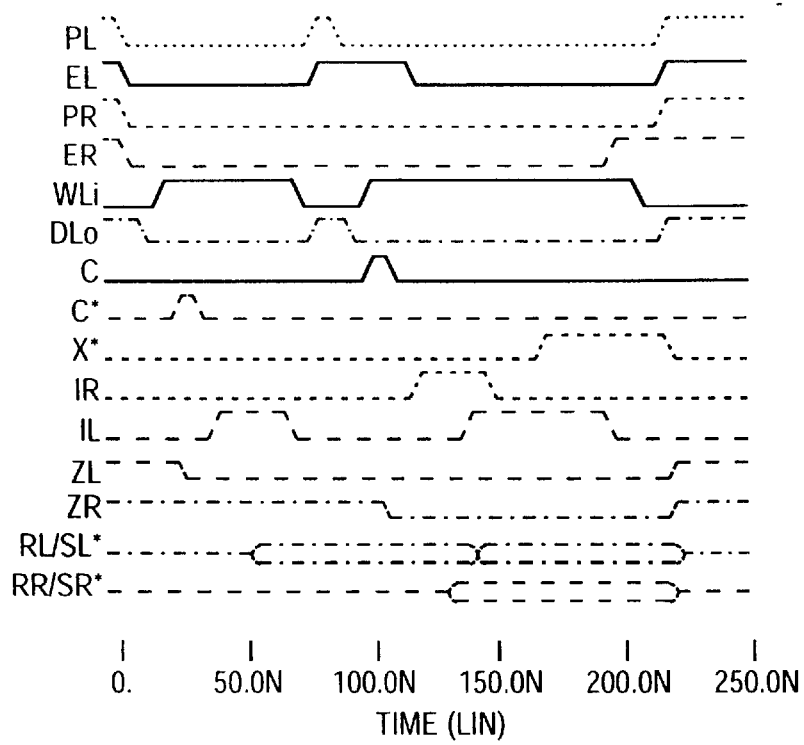

In standard bitline sensing technique described above with reference to FIG. 1, great efforts are made to eliminate any inherent imbalance in the sense amplifier, which may arise from mismatches between the sense amplifier device dimensions. Given the common half-$V_{DD}$ bit line precharge approach, any additional charge shared onto a bit line (or its complement) is used by the sense amplifier to spread the resulting small voltage differential into symmetrical CMOS levels. Any mismatch in this standard single bit per cell approach may cause the sense amplifier not to amplify properly. In the context of multi-level DRAM however, where multiple bits may be stored using more than two voltage levels, the concept of sense amplifier mismatching can be used advantageously.

Figure 2:
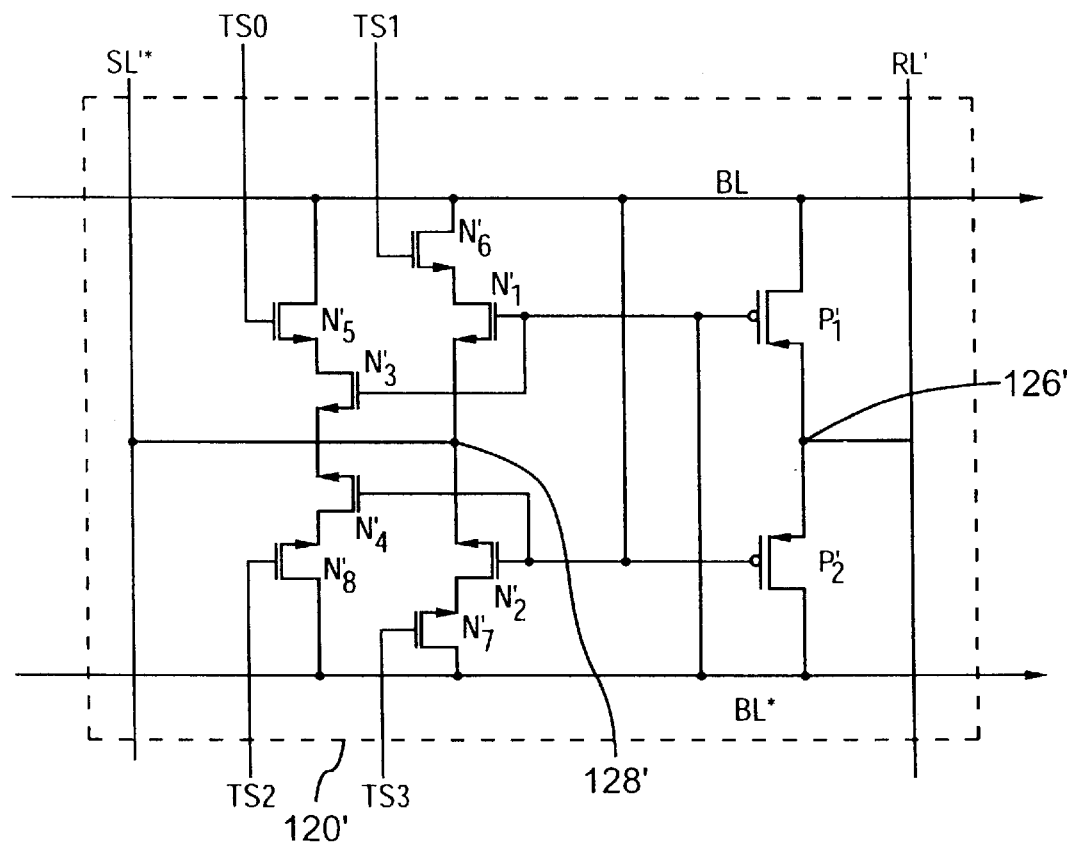
FIG. 2 shows a schematic diagram of a switchable threshold sense amplifier according to an embodiment of the present invention.

Turning now to FIG. 2 an embodiment of a sense amplifier according to the present invention is shown generally by numeral 120'. The sense amplifier comprises a pair of P channel transistors P1' and P2' having with their source drain circuits connected in series, the junction 126' of which is connected to a restore signal line RL'.

The gate connections of P1' and P2' are connected to bitlines BL* and BL respectively. In addition each of the gates of P1' and P2' is connected to the gates of a pair of serially connected N-channel pull down transistor $N_1'$, $N_3'$ and $N_4'$, $N_2'$ respectively. The junction 128' of their source-drain connection is connected to a sense signal SL*'. Each of the transistors $N_1'$, $N_3'$ and $N_4'$, $N_2'$ have their drains connected via the source-drain circuit of respective N-channel transistor $N_6'$, $N_5'$ and $N_8'$, $N_7'$ to bitlines BL and BL* respectively. The transistors $N_{61}'$, $N_5'$, $N_8'$ and $N_7'$ are selection switches which are enabled by selection signals TS1, TS0, TS2 and TS3 respectively.

Although the present invention describes encoding two bits using a four-voltage-level-per-cell system, additional levels may be stored without changing the basic concepts of the invention. Similar to the prior art approach, described with reference to FIG. 1, folded bit lines are divided into sub-bit lines and two sense amplifiers per column are used to sense the two bits. However, instead of using complex, timing-sensitive charge sharing techniques between adjacent sub-bit lines to generate the reference voltage required to sense the second bit as described in the prior art, the present invention selectively enables sense amplifiers to operate at predetermined sensing thresholds, thereby greatly simplifying the sense and restore operations.

As may be seen with reference to the circuit in FIG. 2, the key to the invention is the addition of selective functionality to a typical common bit line sense amplifier. This is accomplished by the addition of specifically sized transistors to the standard bit line sense amplifier configuration to allow the intentional introduction of an imbalance in the sense amplifier-switching threshold. In other words, whereas a typical sense amplifier of the prior art is designed to have its switching threshold at the half-$V_{DD}$, a sense amplifier according to the present invention can be effectively programmed to switch at other voltage levels, thus eliminating the need for the slow and complex generation of sensing reference levels during the active cycle.

Theoretically, the differential sensing voltage $\Delta V$ is given by the general expression:

$$\Delta V = (V_{cell} - V_{BLP}) * (C_{cell}/(C_{cell} + C_{BL}))$$

where $V_{cell}$ and $C_{cell}$ the cell voltage and capacitance, and $V_{BLP}$ and $C_{BL}$ are the bit line precharge voltage and bit line capacitance. In DRAMs, $C_{BL} \cong 10 C_{cell}$ therefore, the above can be approximated to be:

$$\Delta V = (V_{cell} - V_{BLP})/11$$

For a 3.3V $V_{DD}$ system, $V_{BLP}$ is 1.65V. In a multi4level DRAM implementation, if $V_{BLP}$ is taken as the zero reference, then for the following $V_{cell}$ values and their binary configurations corresponding to the sign and magnitude information, the corresponding differential voltages will appear on the bit line for sensing:

| Binary Configuration | | | |
|---|---|---|---|
| Vcell | (sign) | (magnitude) | ΔV |
| 3.3 V | 1 | 1 | 150 mV |
| 2.2 V | 1 | 0 | 50 mV |
| 1.1 V | 0 | 1 | −50 mV |
| 0 V | 0 | 0 | −150 mV |

The table below outlines the various voltages involved in storing the 2-bit DRAM approach according to the prior art.

| Storage Voltages | Reference Voltages | Actual Voltages |
|---|---|---|
| $V_{cell3}$ | | $V_{DD}$ |
| | $V_{REF3}$ | $\frac{5}{6} V_{DD}$ |
| $V_{cell2}$ | | $\frac{2}{3} V_{DD}$ |
| | $V_{REF2}$ | $\frac{1}{2} V_{DD}$ |
| $V_{cell1}$ | | $\frac{1}{3} V_{DD}$ |
| | $V_{REF1}$ | $\frac{1}{6} V_{DD}$ |
| $V_{cell0}$ | | $V_{SS}$ |

As discussed in the prior art, the sense amplifiers operate with voltage differences in the 50–100 mV range. For the four voltage levels stored in the cell, there are four corresponding voltages appearing on the bit lines to be sensed. The sign bit is sensed with respect to $V_{REF2}$ i.e. ½ $V_{DD}$. The magnitude bit is sensed either with respect to $V_{REF1}$ or $V_{REF3}$. As a result, either $V_{REF1}$ or $V_{REF3}$ must be generated as part of the active cycle and during the sensing period. This requires a time-consuming complex charge sharing scheme to be implemented.

According to an embodiment of the present invention, an imbalance is purposely introduced by varying the channel lengths and/or widths of the NMOS and/or PMOS transistors in the sense amplifier to allow it to properly sense these four differential voltage values. The effect of an imbalance in the component transistors results in an offset in the differential mode voltage.

Turning back to FIG. 2, the standard CMOS bit line sense amplifier transistors P1', P2' and any two of the four NMOS pull down transistors say, N1' and N2' for example, transistors N3'–N8' are inserted into the circuit as shown (alternately, PMOS additional transistors may be employed using the same concept, as shown later). Specifically, transistors N5'–N8' represent selection switches to be enabled by the signals TS0*, TS3. Preferably, TS0=TS2 and TS1=TS3 and furthermore, TS1=TS0* and TS3=TS2*, i.e. the two sets of control signals are complementary. The introduction of transistors N3' and N4' for example, as well as the specific sizing of these two transistors along with specific sizing for N1' and N2', illustrate the main concept of the present invention. By sizing the four transistors N1'–N4' differently and by adding the selectable switches N5'–N8', the switching threshold of the sense amplifier can be modified to emulate the two reference voltages which are generated in the prior art as part of an active sensing operation.

As an example of the general operation, considering only variations in gate length, (although both length and width may be varied according to design constraints), assume that transistors N1', N2', N3' and N4' have predetermined lengths L1, L2, L3 and L4 respectively. Assume further that the gate lengths of transistors N5'–N8' are a minimum. It has been found that conditions in the range of 0.35 μm to 2.5 μm are effective. Since TS0=TS2, both N5' and N8' for example, will be on simultaneously. By making L3 relatively short in comparison with L4, a skew towards the N3', N5' branch of the sense amplifier will be introduced. Since N3' has a shorter gate length than N4', it will also have a smaller threshold voltage $V_t$ and will therefore turn ON for lower voltages applied to its gate. It is also important however, to keep in mind that while the N3', N5' NMOS transistor branch is conducting, the PMOS transistor P1' is also somewhat conductive. Therefore, in choosing the appropriate length of N3', the PMOS conduction of P1' must also be taken into consideration. The result will be a skewed inverter consisting of PMOS P1', NMOS N5', and N3' which will have a switching threshold at a point lower than $V_{DD}/2$. Similarly, the switching threshold of the inverter can also be adjusted upwards by enabling an NMOS transistor in the series path, for example, which has a higher Vt and will therefore switch at higher voltage levels and will skew the inverter to a higher switching point.

Figure 3:
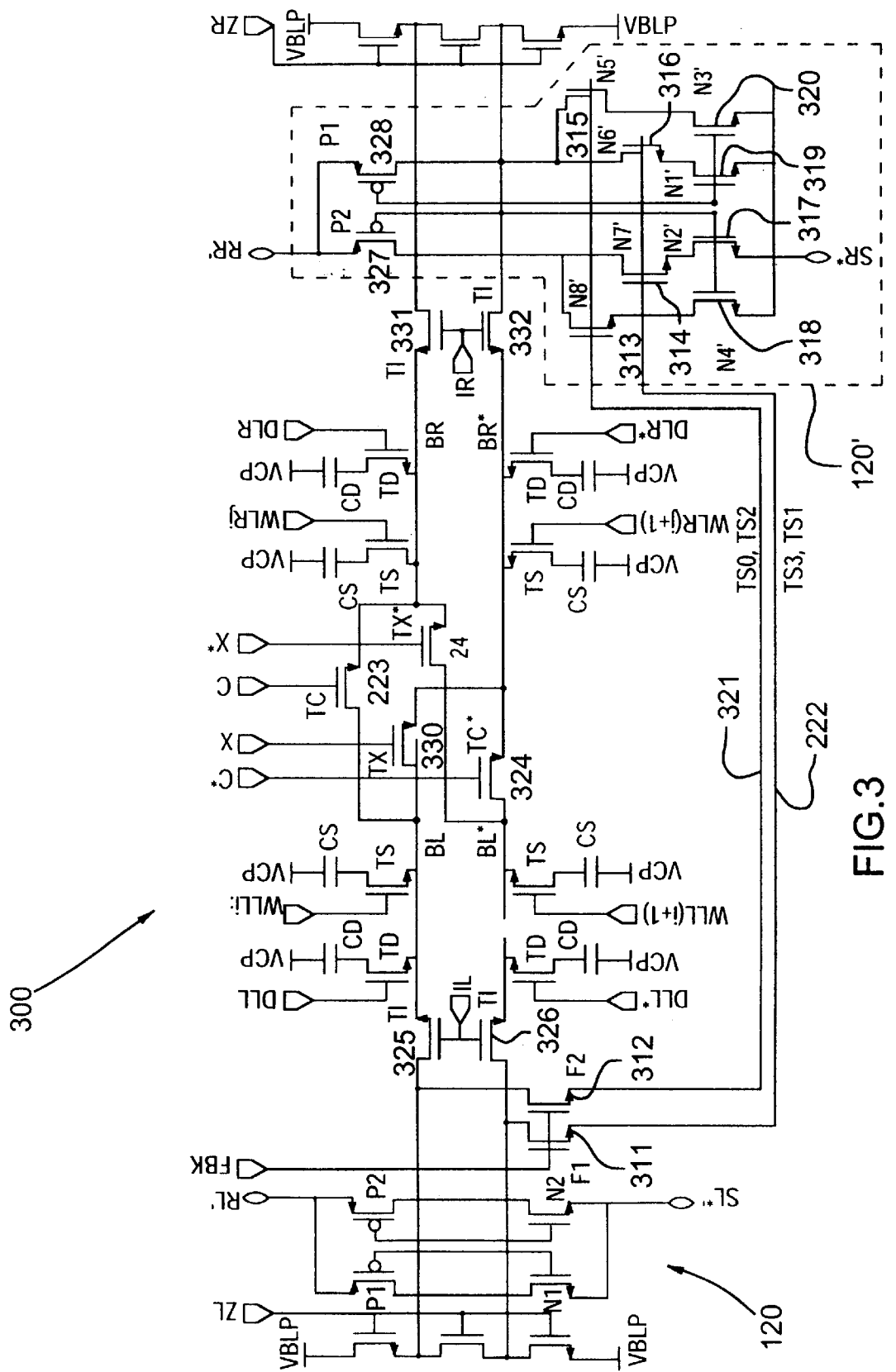
FIG. 3 is a schematic diagram of a multilevel configuration for the sense amplifiers according to an embodiment of the present invention.

Referring to FIG. 3, a memory column for a multilevel DRAM implementation using the sense amplifier of FIG. 2 having left (BL, BL*) and right (BR, BR*) bitlines is shown generally by numeral 300. As may be seen the circuit configuration is similar to the circuit shown in FIG. 1(a) also described in U.S. Pat. No. 5,612,912 incorporated herein by reference. The novel features have been numbered and will be described in detail thus similar reference characters will refer to corresponding signals and circuit elements. The novel features have been numbered accordingly and will be described in detail. Analogous control signals will be referred to by a prime character added to the corresponding reference character shown in FIG. 1(a). The right bitlines BR and BR* are connected via the source drain circuit of transistors T1 to sense amplifier circuit 120' of FIG. 2. A pair of feedback transistor F1 and F2 have their source drain circuits connected between the left bitlines BL*, BL and the gates of transistor N8', N5' and N7', N6' respectively. The feedback transistors are controlled by a signal FBK connected to the gates.

Figure 4:
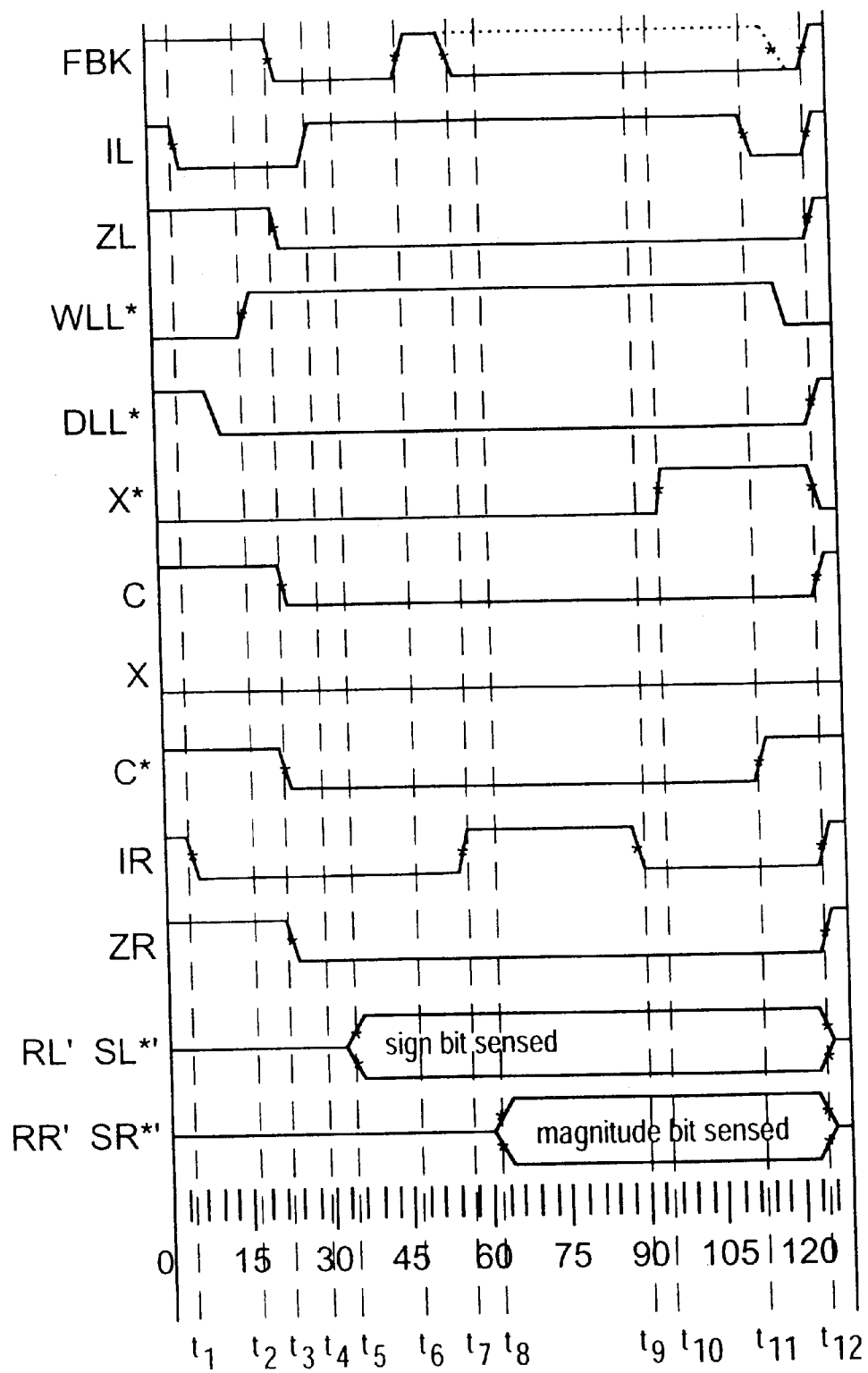
FIG. 4 is a timing diagram for signals in circuitry of FIG. 3.

With the aid of timing diagram in FIG. 4, the operation of the implementation shown in FIG. 3 will now be explained. During precharge state, bitlines BL and bitlines BL* as well as bitlines BR and bitlines BR* are all precharged to $V_{BLP}$ through the left and right precharge devices driven by ZL and ZR respectively. As can be seen in FIG. 4, both ZL and ZR start out high. The isolation devices TI (325, 326) and (331, 332) controlled by IL and IR are also turned on during precharge, allowing a uniform precharge voltage across both left and right sub-bitlines.

When an active cycle begins, the isolation signals TI are both turned off at $t_1$. Assuming that a cell on the left side is to be accessed, the dummy word line DLL is switched off (low) and the selected word line on the left side, $WLL_i$ is enabled at $t_2$. Then, at $t_3$, both left and right precharge signals ZL and ZR are disabled, the feedback signal FBK is also disabled in order to allow for sensing of the sign bit on the left side sense amplifier 120. Furthermore, the left/right coupling devices TC and TC* are turned off by the C and C* signals both being low. At time $t_4$, the left isolation signal IL enables the left side isolation devices TI (325, 326) once again, in order to allow the left sense amplifier 120 to sense the sign bit Finally, at $t_5$, the sense and restore power signals SL and RL for the left side are enabled and sensing of the sign bit occurs.

The second portion of the sense operation involves sensing the magnitude bit using the information from the sensed sign bit. At $t_6$, the feedback signal FBK is switched on to feed the sign bit information back to the magnitude bit sense amplifier 120'. If bitlines BL is high for example, transistor F2 (312) (assuming $WLL_i$ has been selected) will pass this information to the magnitude sense amplifier 120' and turn on transistors $N_8'$ (313) and $N_5'$ (315). During this time, the magnitude information has been resting in the cell as well as on bitlines BR, since the coupling transistor TC (323) was not turned off until the data was also put onto bitlines BR. For the purpose of example, assume that the actual data was at $V_{cell2}$ voltage level, i.e. ⅔ $V_{DD}$ according to Table 1. In binary form, the storage configuration for sign and magnitude would be 10. In the prior art approach, a reference voltage Vref3 would have to now generated by charge sharing bitline BL, bitline BR and bitline BL* in order to sense the magnitude bit. The final sensed magnitude voltage would fall below this generated reference voltage. The complex and time consuming charge sharing operation is very sensitive to various factors such as balanced control signal coupling as well as the need for signals to reach their final state in the allocated time segment, and can cause improper sensing if those factors are not close to ideal.

According to the embodiment shown in FIG. 3 however, the present invention eliminates the need for the charge sharing step and reference voltage generation during sensing. Instead, by sizing the transistors $N_1'$–$N_8'$ in the magnitude sense amplifier 120' according to predetermined levels and by feeding back the sign bit information, the effect of generating the reference voltage of the prior art is emulated by offsetting the switching threshold of the magnitude sense amplifier. The sign bit therefore determines the magnitude threshold of the magnitude bit. Specifically, by sizing transistor $N_4'$ (318) to have a larger drive capability than transistor $N_3'$ (320) for example, by shortening the gate length or increasing the width or a combination of both, the switching threshold of branch consisting of transistors $N_4'$ (318), $N_8'$ (313) and $P_2'$ (327) will be shifted to a point 100 mV lower than that of the branch consisting of P' (328), $N_5'$ (315), and $N_3'$ (320). The data sitting on bitlines BR will then have to switch this offset threshold. At $t_7$, the feedback signal may be turned off and the right side isolation devices are turned on in preparation of sensing the magnitude bit. The right side sense and restore power signals SR* and RR are enabled at $t_8$. Since the threshold of branch $N_4'$ (318), $N_840$ (313) and $P_2'$ (327) is 100 mV lower than that of the branch consisting of P1' (328), $N_5'$ (315), and $N_3'$ (320), and since the data corresponding to the 10 configuration (approximately 50 mV according to Table 1 b) is sitting on bitlines BR, the transistor branch $N_4'$ (318), $N_8'$ (313), $P_2'$ (327) will pull bitlines BR low, and branch $P_1'$ (328), $N_5'$ (315) and $N_3'$ (320) will pull bitlines BR* high. This last step completes the sensing of the magnitude bit.

Note that unlike in the prior art, the selected word line $WLL_i$ is only activated once and therefore only one row activation path is necessary. This represents a substantial area savings over the prior art multi-level DRAM architecture.

To accomplish the restore, beginning at $t_9$, the right side isolation devices T1, (331,332) are switched off. Shortly thereafter, the cross-coupling transistor TX* (329) controlled by signal X* is turned on in order to accomplish a similar charge sharing effect as in the prior art restore. At $t_{11}$, the left side isolation devices are also switched off and the coupling transistor 324 controlled by C* is switched on. At this time, as bitlines BR, bitlines BL* and bitlines BR* are all shorted together, the charge sharing occurring completes the restore operation. Note once again that the word line was only activated once for both the sense and the restore.

The ability therefore to switch the threshold of the sense amplifier on the fly during the sensing operation by selecting the transistor to be used for sensing allows multiple thresholds to be programmed into the circuit and, if constructed correctly, allow for multilevel sensing.

Figure 5:
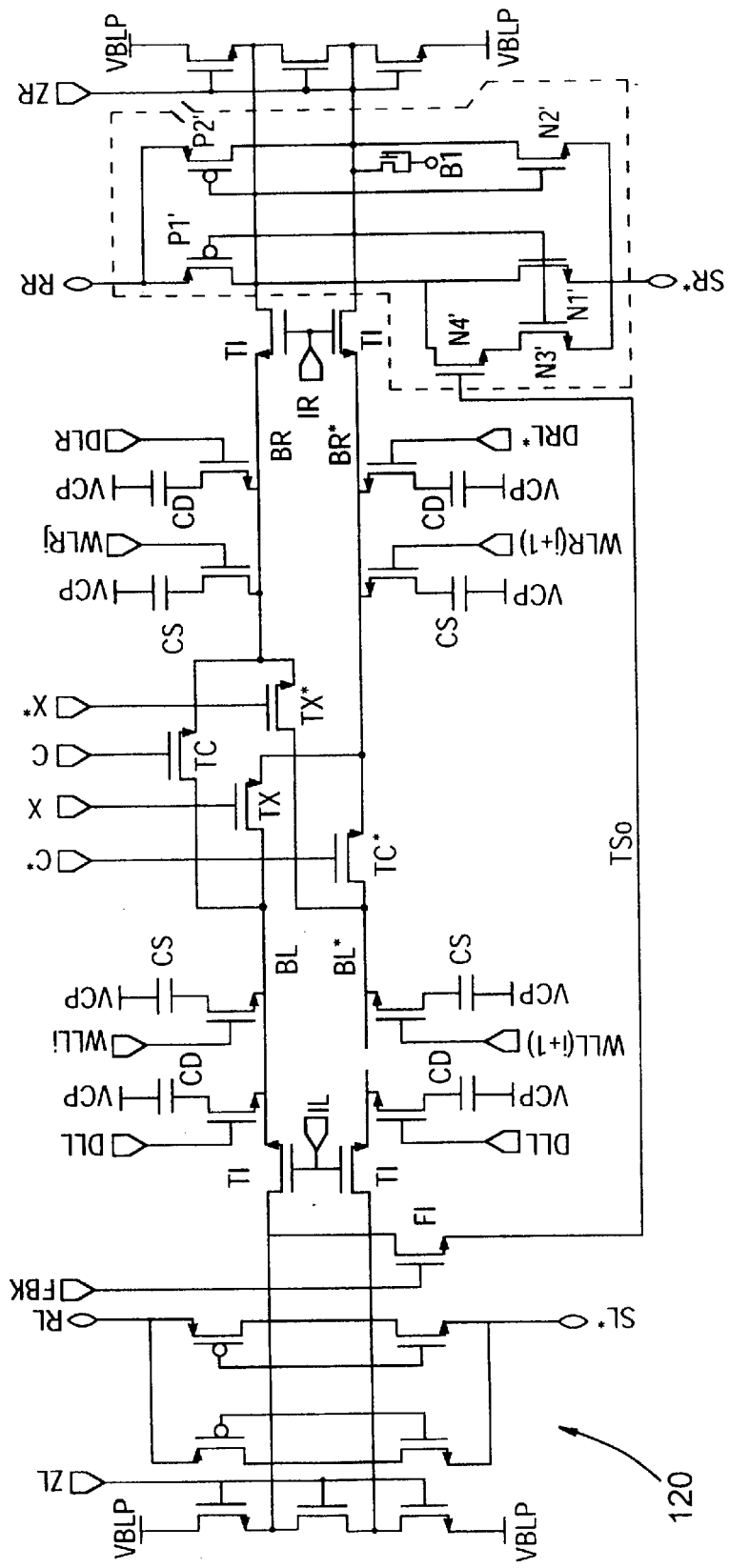
FIG. 5 is a schematic diagram of reduced device count configuration.

FIG. 5 illustrates a reduced device count configuration for multilevel DRAM implementation. In this approach, one of the NMOS pull down transistors N2', is set at the reference device width W, for example. Then the other two NMOS pull down transistors, N1' and N3' are sized with widths smaller and larger than N2', i.e. width of N1'=W–Δ and width of N3'=W+Δ. With this approach, one device is omitted for every adjustable threshold sense amplifier. However, this absence of an extra device on the P2' N2' branch for example will make that branch switch more quickly than the P1', N4', N3' or N1' branch. Therefore, an additional dummy device D1 may have to be inserted with its gate grounded to provide the balanced switching characteristics.

Another design variation can address inaccuracies in the switching threshold adjustment caused by improper device sizing due to process variations and/or fluctuating operating voltages. A well or substrate connection for the switching threshold adjust devices will assist in maintaining the device performance more constant under such circumstances.

Figure 6A:
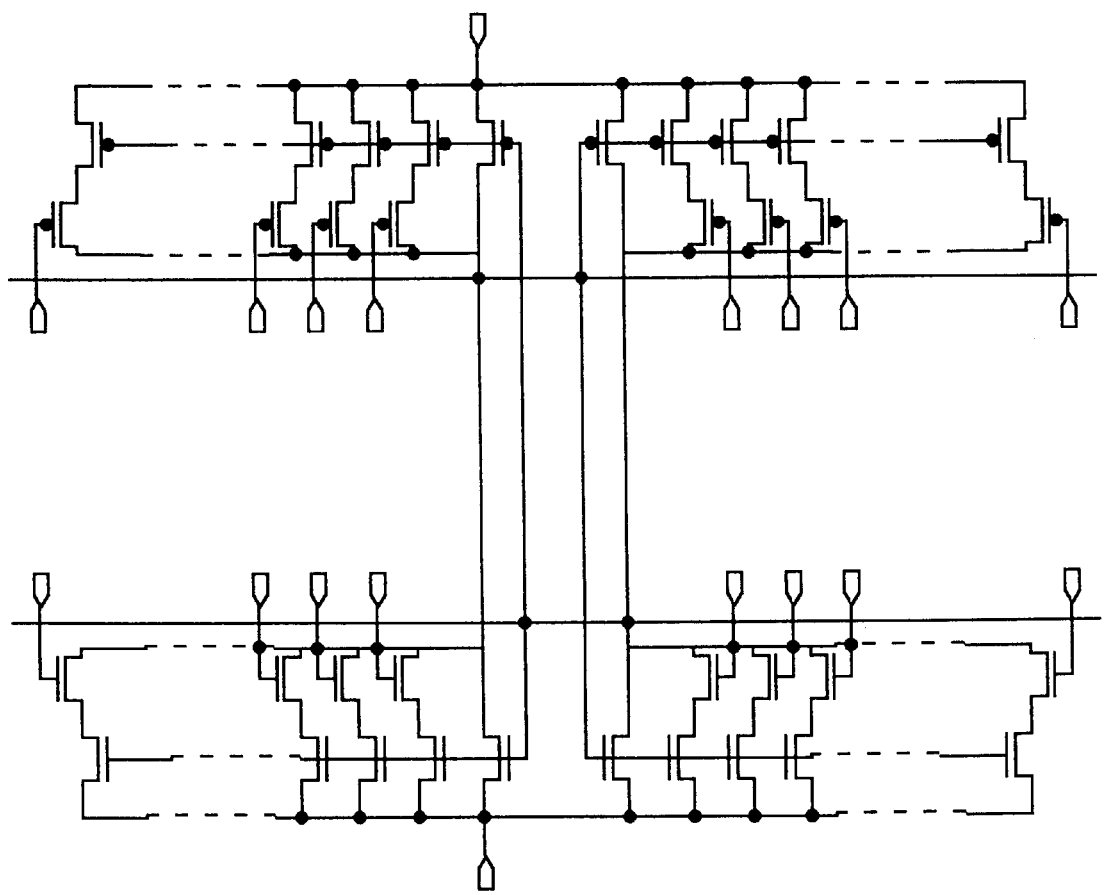
FIGS. 6(a) and 6(b) show schematic diagrams of a parallel and a series configuration respectively.
Figure 6B:
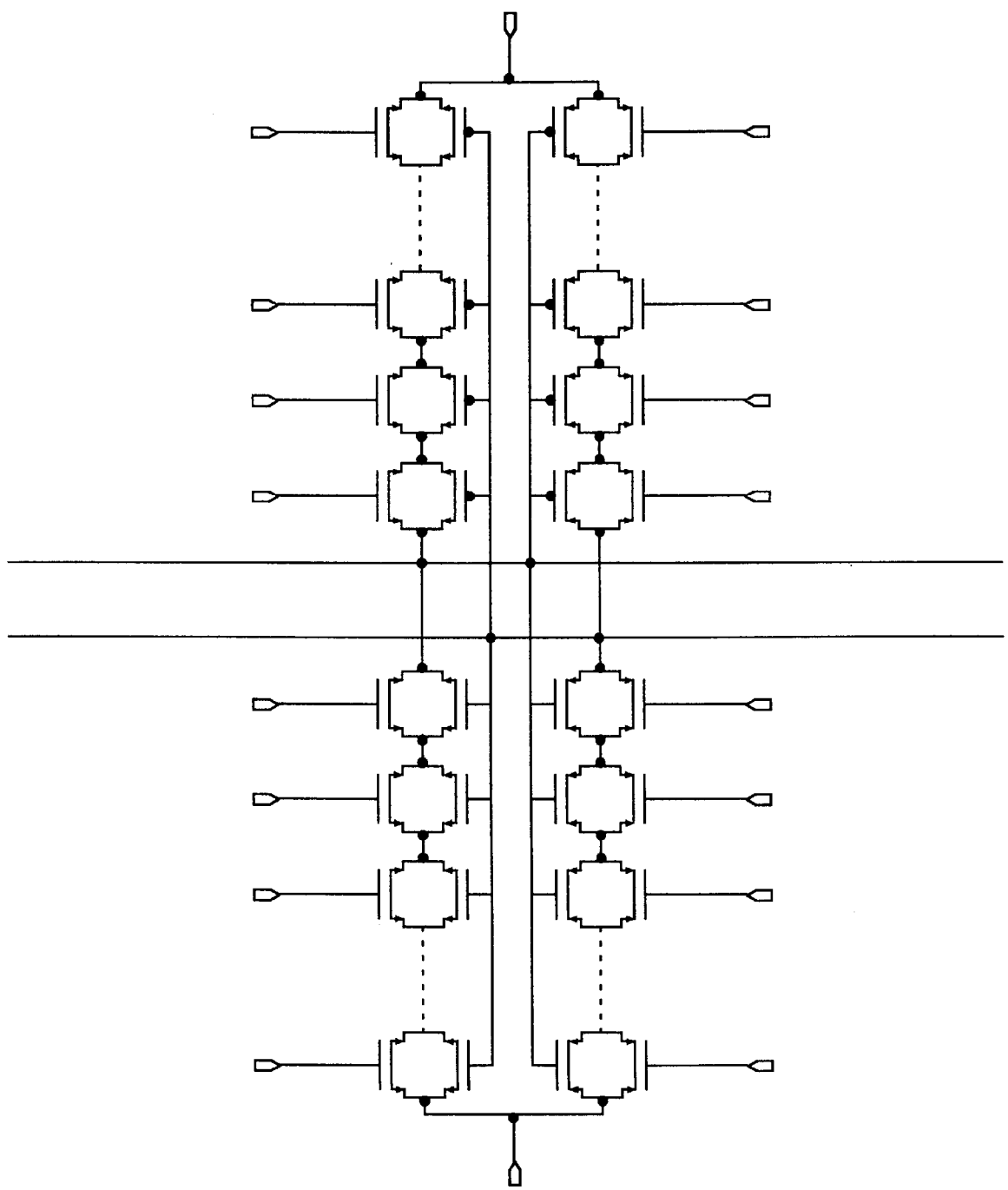

FIG. 6a and FIG. 6b illustrate other possible configurations. All the series and parallel configurations are shown in these two general cases. The pass transistor shown may be N or P type.

Figure 7:
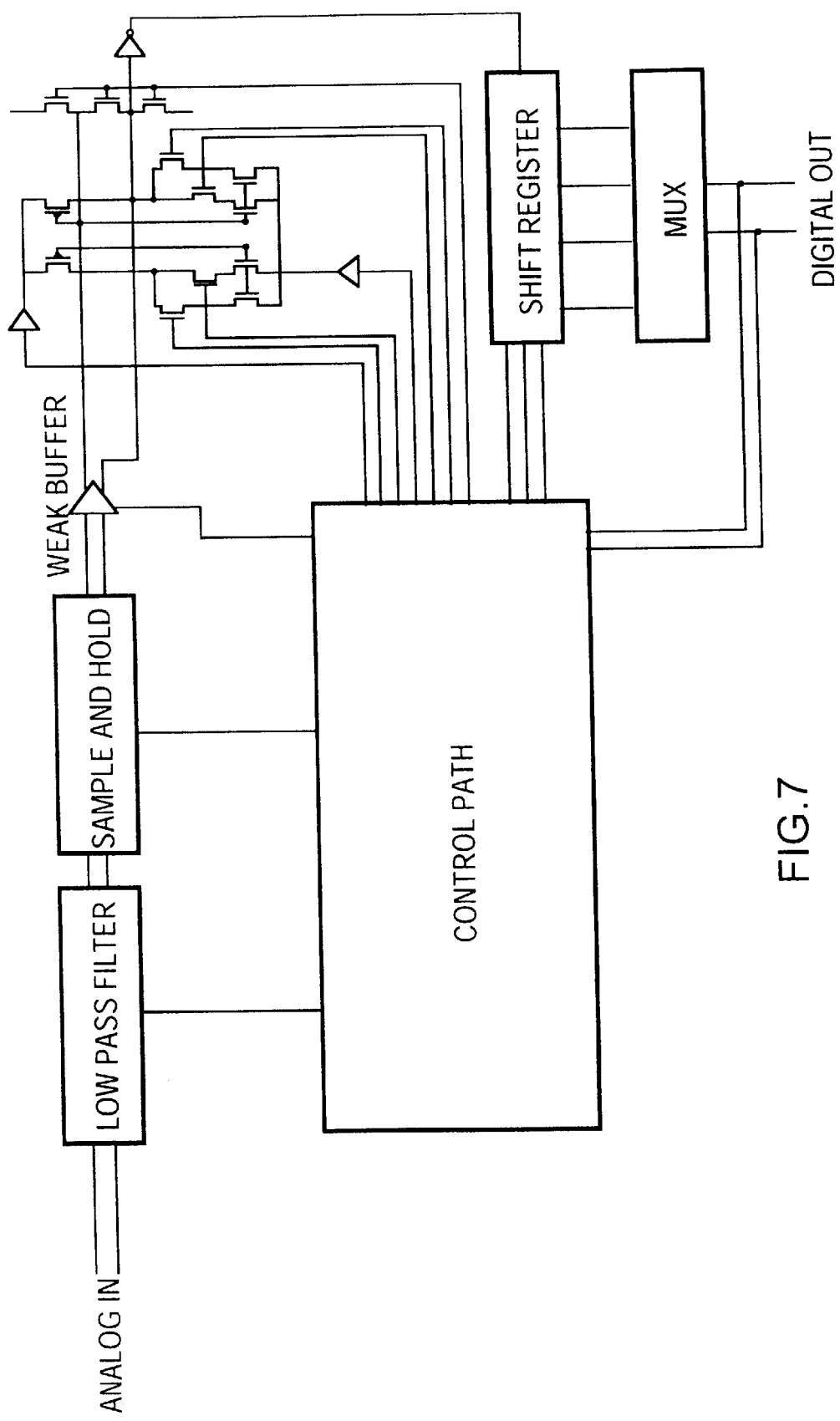
FIG. 7 is a schematic diagram of an A/D conversion circuit.

FIG. 7 illustrates an embodiment of the present invention for A/D conversion with an array of sense amplifiers. Differential analog inputs are passed through a low pass filter and through a sample and hold circuit, both under the control of a main control circuit. The analog signals are then passed through a weak buffer, a non-inverting differential amplifier for example, and then input into a switching threshold adjustable sense amplifier according to an embodiment of the present invention. The gate control signals used to select the switching threshold are provided by the main control circuit. The output of the sense amplifier is inverted and then passed through a shift register and a multiplexer to the digital output. An array of such sense amplifier circuits can be arranged to cover various analog levels and inputs.

While the invention has been described in connection with the specific embodiment thereof, and in a specific use, various modifications thereof will occur to those skilled in the art without departing from the spirit of the invention as set forth in the appended claims.

The terms and expressions which have been employed in this specification are used as terms of description and not of limitations, there is no intention in the use of such terms and expressions to exclude any equivalence of the features shown and described or portions thereof, but it is recognized that various modifications are possible within the scope of the claims to the invention.

The embodiments of the invention in which an exclusive property or privilege is claimed are defined as follows:

1. A sense amplifier circuit for differentially amplifying potentials between a first bitline and a second bitline, said sense amplifier circuit comprising:

(a) a first sense transistor, its source-drain circuit coupled between said first bitline and a restore signal node, and a gate coupled to said second bitline;

(b) a second sense transistor source-drain circuit coupled between said second bitline and said restore signal node and a gate coupled to said second bitline;

(c) a first threshold transistor and a second threshold transistor having a first and a second threshold voltage, respectively, said first and said second threshold transistors having their respective gates coupled to said gate of said first sense transistor;

(d) a third threshold transistor and a fourth threshold transistor having a third and a fourth threshold voltage, respectively, said third and said fourth threshold transistors having their respective gates coupled to said gate of said second sense transistor;

(e) a first selection transistor and a second selection transistor connected in series with said first threshold transistor and said second threshold transistor, respectively, having their gates connected to respective first and a second selection signal; and, (f) third selection transistor and a fourth selection transistor connected in series to said third threshold transistor and said fourth threshold transistor, respectively, having their gates connected to a third and a four selection signal, respectively, said selection transistors being responsive to said selection signals for selectively enabling said threshold transistors, whereby the switching threshold of said sense amplifier is varied.

2. The sense amplifier circuit as defined in claim 1 wherein said first and said second sense transistors are P channel transistors.

3. The sense amplifier circuit as defined in claim 1 wherein said first, said second, said third, and said fourth threshold transistors are N channel transistors.

4. The sense amplifier circuit as defined in claim 1 wherein said first, said second, said third, and said fourth selection transistors are N channel transistors.

5. The sense amplifier circuit as defined in claim 1 wherein said first and said second selection signals are equal in magnitude.

6. The sense amplifier circuit as defined in claim 5 wherein said first and said second selection signals are connected to a bitline.

7. The sense amplifier circuit as defined in claim 5 wherein said first and said second selection signals are connected to the output of a sign sense amplifier.

8. The sense amplifier circuit as defined in claim 1 wherein said third and said fourth selection signals are equal in magnitude.

9. The sense amplifier circuit as defined in claim 8 wherein said third and said fourth selection signals are connected to a bitline.

10. The sense amplifier circuit as defined in claim 8 wherein said first and said second selection signals are connected to the output of a sign sense amplifier.

* * * * *